US009022216B2

(12) United States Patent
Ku et al.

(10) Patent No.: US 9,022,216 B2
(45) Date of Patent: May 5, 2015

(54) RETICLE POD WITH DRAIN STRUCTURE

(71) Applicant: Gudeng Precision Industrial Co., Ltd., New Taipei (TW)

(72) Inventors: Chen-Wei Ku, New Taipei (TW); Pao-Yi Lu, New Taipei (TW); Chin-Ming Lin, New Taipei (TW); Jain-Pin Sheng, New Taipei (TW)

(73) Assignee: Gudeng Precision Industrial Co., Ltd., New Taipei (TW)

( * ) Notice: Subject to any disclaimer, the term of this patent is extended or adjusted under 35 U.S.C. 154(b) by 260 days.

(21) Appl. No.: 13/675,141

(22) Filed: Nov. 13, 2012

(65) Prior Publication Data

US 2013/0126378 A1 May 23, 2013

(30) Foreign Application Priority Data

Nov. 17, 2011 (TW) .............................. 100142147 A (51) Int. Cl.
*B65D 85/48* (2006.01)
*H01L 21/673* (2006.01)

(52) U.S. Cl.
CPC .......... *B65D 85/48* (2013.01); *H01L 21/67359* (2013.01); *H01L 21/67386* (2013.01)

(58) Field of Classification Search
USPC ......... 206/454, 710, 711, 832; 220/23, 23.89, 220/87; 355/30, 72, 75
See application file for complete search history.

(56) References Cited

U.S. PATENT DOCUMENTS

| | | | | |
|---|---|---|---|---|
| 6,216,873 B1 * | 4/2001 | Fosnight et al. | ............... | 206/710 |
| 6,315,124 B1 * | 11/2001 | Hirohata et al. | ............... | 206/454 |
| 6,732,877 B2 * | 5/2004 | Wu et al. | ......................... | 206/710 |
| 7,523,829 B2 * | 4/2009 | Mimura et al. | ............... | 206/710 |
| 7,607,543 B2 * | 10/2009 | Gregerson et al. | ............. | 206/710 |
| 7,931,146 B2 * | 4/2011 | Chiu et al. | ...................... | 206/454 |
| 2004/0005209 A1 * | 1/2004 | Su et al. | ......................... | 206/710 |
| 2007/0206173 A1 * | 9/2007 | Suzuki et al. | .................... | 355/75 |
| 2007/0215516 A1 * | 9/2007 | Sumi | .............................. | 206/711 |

* cited by examiner

*Primary Examiner* — Luan K Bui
(74) *Attorney, Agent, or Firm* — Rosenberg, Klein & Lee (57) ABSTRACT

A reticle pod with drain structure comprises an outer container and an inner container, wherein an upper cover of inner container is disposed with a plurality of retainers, and a plurality of supporters disposed on the outer container are used to press the retainers for fastening and stabilizing the reticle in the inner container and thus ensuring safety and stability of the reticle in the reticle pod. Collision risks of the reticle in the reticle pod due to vacillation of reticle pod during transportation can be reduced. Cost of reticles also can be greatly decreased. Further, a plurality of drain holes is disposed on a lower cover of the outer container for draining the remained water in the outer container. It will be done without disassembling the lower cover of outer container for reducing the contamination opportunity in the pod and preventing from wasting of labor and time for disassembling.

17 Claims, 5 Drawing Sheets

RETICLE POD WITH DRAIN STRUCTURE

CROSS-REFERENCES TO RELATED APPLICATIONS

This application claims priority to Taiwan Patent Application No. 100101022, filed Jan. 11, 2011, the contents of which are hereby incorporated by reference in their entirety.

BACKGROUND OF THE INVENTION

1. Field of the Invention

The present invention is related to a reticle pod, and more particularly, to a reticle pod with drain structure.

2. Description of the Prior Art

In the rapidly developing modern semiconductor technology, optical lithography technique plays an important role. The pattern definition relies fully upon optical lithography technique. In the application of optical lithography technique related to semiconductors, pre-designed circuit layouts are fabricated as light-transparent reticle in specific form. Basing on the principle of exposure, after light from the light source passes through the reticle and is projected on a silicon wafer, a specific circuit pattern can be exposed on the silicon wafer. However, since any kind of dust (such as particles, powders, and organic matters) that adhere to the reticle can result in quality degradation of projected pattern, the reticle used to produce pattern on silicon wafers is required to be kept absolutely clean. Therefore, a cleanroom environment is usually provided in ordinary wafer fabrication processes to prevent from contamination caused by particles in the air.

Recently, in order to further scale down the chip feature sizes, EUV (extreme ultraviolet light) at a wavelength of 157 nm is applied in lithography apparatus for the pattern on reticle to be imaged with higher resolution when being projected on the surface of a silicon wafer. However, when EUV is applied, the requirements for cleanliness of reticle pod are also, relatively speaking, higher. Particles smaller than 30 μm are previously acceptable, but as far as reticle pods for use with EUV lithography techniques are concerned, only particles with sizes between 30 and 50 nm are acceptable.

As a result, anti-contamination reticle pods are used in modern semiconductor process to store and carry reticles and to maintain the cleanliness of reticles; on the other hand, anti-contamination storage containers for semiconductor components are also used for storing and carrying semiconductor components and also for maintaining the cleanliness of semiconductor components. Reticle pods are used in the semiconductor process for storing reticles and for facilitating the carrying and transporting of reticles between platforms in order to isolate reticles from the air and thus prevent haze from forming on the surface of reticles due to contamination of reticles caused by particles and chemical gas. Thus, in advanced semiconductor plants, the cleanliness of reticle pods or storage devices for semiconductor components is usually required to comply with the SMIF (Standard Mechanical Interface) standard, in other words, to be maintained at Class 1 or below.

Figure 8:
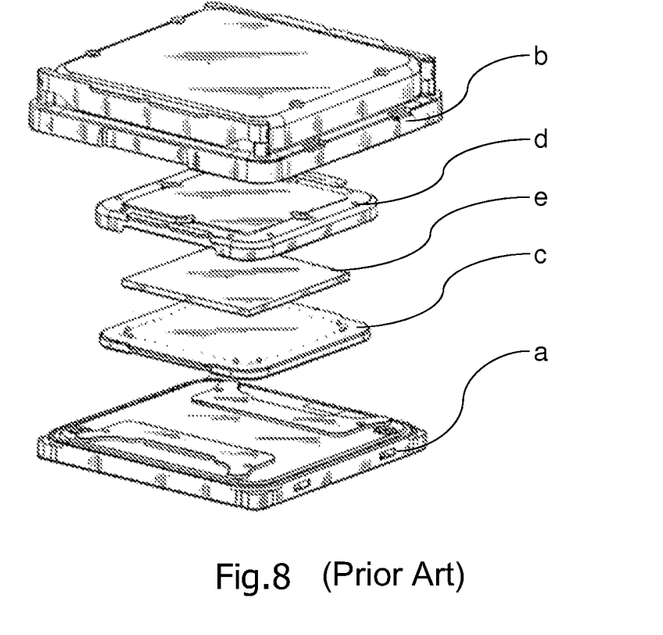
FIG. 8 is a view of the reticle pod of the prior art.

In order to reduce contamination generated during the process of storing, manufacturing, and transporting, a technology that uses a double-layer container for isolating the reticle has been proposed in the prior art, wherein an inner container is used for carrying the reticle and an outer container is used for fastening the inner container therein. As shown in FIG. 8, the lower cover c and the upper cover d of an inner container cover the reticle e and fasten the reticle e within the inner container, and then the lower cover a and the upper cover b of an outer container cover the inner container and fasten the inner container within the outer container. In the double-layer pod structure, supporters disposed in an outer container are usually used for fastening the inner container. However, in such double-layer pod structure, the user is unable to determine whether the inner container is stably snap-fastened by the supporters of the outer container and is unable to make sure the positioning status of the reticle in the inner container either. In consideration of the aforementioned, the present invention provides a reticle pod in which supporters of the outer container are used to press retainers of the inner container and thus indirectly fasten the reticle inside for ensuring safety and stability of the reticle in the reticle pod.

Besides, during cleaning, the conventional pod has no design to drain the remained water in the bottom side. Thereby, the remained water in the conventional pod under cleaning cannot be removed easily, and the water spot or other contaminations will be remained in the conventional pod. Accordingly, the contamination chance of the reticle will be increased.

SUMMARY OF THE INVENTION

In order to solve the above-mentioned problem, one primary object of the present invention is to provide a reticle pod with a drain structure, in which the remained water is removed directly from the drain holes on the outer container during cleaning the reticle pod without disassembling the outer container. Therefore, the contamination chance of the reticle will be reduced efficiently as well as the wasting of labor and time can be prevented from.

Another primary object of the present invention is to provide a reticle pod with a drain structure, in which a centrifugal force is generated to accelerate the draining of the remained water, and the remained water in the reticle pod is drained by the drain holes.

Another primary object of the present invention is to provide a reticle pod with a drain structure, in which supporters disposed on the outer container are used to press retainers of the inner container for indirectly fastening reticle inside the pod and thus ensuring the safety and stability of the reticle inside.

Another primary object of the present invention is to provide a reticle pod with a drain structure, in which supporters disposed on the outer container are used to press retainers of the inner container for preventing the inner container from shifting and further ensuring the safety of the reticle inside the inner container.

According to the objectives above, the present invention provides a reticle pod with a drain structure, comprising: an outer container, comprising: and a lower cover of outer container, having a first inner surface and four sides connected with said first inner surface, a plurality of first supporters being formed on said first inner surface, a plurality of drain holes disposed on the lower cover of outer container; an upper cover of outer container, having a second inner surface, a plurality of second supporters being formed on said second inner surface, said first inner surface and said second inner surface forming a first accommodation space when said lower cover of outer container and said upper cover of outer container are joined together; and an inner container comprising: a lower cover of inner container, being disposed in said first accommodation space and being in contact with said first supporters, said lower cover of inner container having a first inner surface of inner container; and an upper cover of inner container, being in said first accommodation space and having a second inner surface of inner container and an outer surface of upper cover of inner container which is on opposite side of said second inner surface of inner container, said first inner surface of inner container and said second inner surface of inner container forming a second accommodation space for accommodating a reticle when said lower cover of inner container and said upper cover of inner container are joined together; a plurality of through holes, being formed between said second inner surface of inner container and said outer surface of upper cover of inner container; and a plurality of retainers, being respectively disposed in said plurality of through holes, the position of each of said plurality of retainers corresponding to each of said second supporters of said upper cover of outer container.

According to the object above, the present invention provides a reticle pod with a drain structure, comprising: an outer container, comprising: a lower cover of outer container, said lower cover of outer container having a first inner surface and four sides that are joined with said first inner surface, a plurality of drain holes being disposed on said lower cover of outer container; and an upper cover of outer container having a second inner surface, said first inner surface and said second inner surface forming a first accommodation space for accommodating a reticle when said lower cover of outer container and said upper cover of outer container are joined together.

DESCRIPTION OF THE PREFERRED EMBODIMENTS

As the present invention discloses a reticle pod, and more particularly, a reticle pod with a draining structure; the inner container, outer container, and the filtering material employed in the embodiments of reticle pod of the present invention are achieved by using current technologies and the description of which is thus omitted. Moreover, the drawings referred to in the following description are not made according to the actual scale and only function as illustrations demonstrating characteristics of the present inventions.

Figure 1:
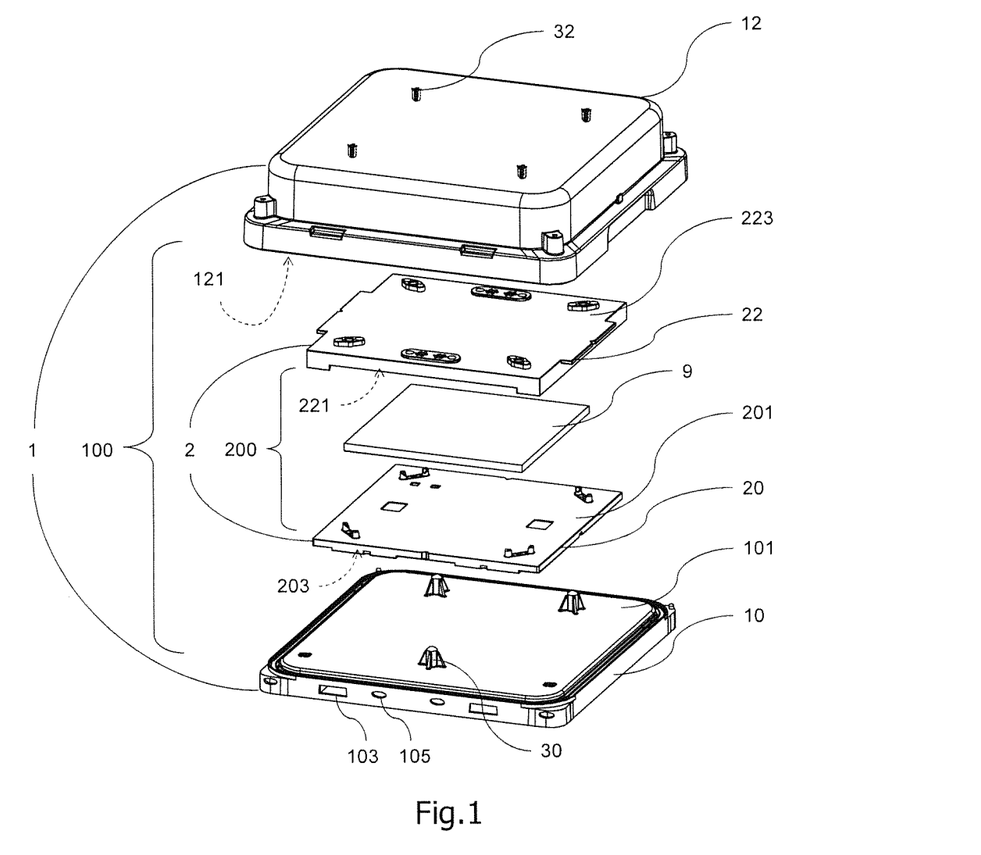
FIG. 1 is an explosive view of the reticle pod of the present invention.

First, referring to FIG. 1, which is an explosive view of the reticle pod of the present invention. As shown in FIG. 1, the reticle pod comprises an outer container 1 and an inner container 2, wherein the outer container 1 comprises a lower cover of outer container 10 having a first inner surface 101 with a plurality of first supporters 30, and an upper cover of outer container 12 having a second inner surface 121 with a plurality of protruding second supporters 32, a first accommodation space 100 being formed between the first inner surface 101 of the lower cover of outer container 10 and the second inner surface 121 of the upper cover of outer container 12 for accommodating and fastening the inner container 2 when the lower cover of outer container 10 and the upper cover of outer container 12 are joined together. The inner container 2 comprises a lower cover of inner container 20 having a first inner surface of inner container 201 and an outer surface of lower cover of inner container 203 opposite to the first inner surface of inner container 201, the outer surface of lower cover of inner container 203 contacts the plurality of first supporters 30. An upper cover of inner container 22 has a second inner surface of inner container 221 and an outer surface of upper cover of inner container 223 opposite to the second inner surface of inner container 221, a second accommodation space 200 being formed between the first inner surface of inner container 201 and the second inner surface of inner container 221 for accommodating a reticle 9 when the lower cover of inner container 20 and the upper cover of inner container 22 are joined together.

Furthermore, in the embodiment, four sides of the lower cover of outer container 10 are disposed with a plurality of drain holes 105, which are shown as round holes in FIG. 1; and a pair of lock holes 103, which are shown as rectangular holes in FIG. 1, are further disposed on two opposite sides 102 among four sides of the lower cover of outer container 10. Apparently, as the lower cover of outer container 10 is disposed with a latch (not shown in Figure), when the latch is turned to close the outer container, the latch projects into the lock holes 103. An objective of disposing a plurality of drain holes 105 is as thus: after the lower cover of outer container 10 of the reticle pod of the present invention is cleaned with water, water molecules remaining in the lower cover of outer container 10 can be directly drained out through the plurality of drain holes 105 without disassembling the lower cover of outer container 10 after heating and baking processes are performed. Thereby, it will prevent from the wasting of the labor and time for disassembling the lower cover of outer container 10 and decrease the contamination chance in the reticle pod.

Furthermore, the disposition locations of the drain holes 105 in the embodiment are corresponding to the tangent direction of rotation generated under cleaning of the reticle pod. The reticle pod is disposed on a conventional rotatable washing machine during cleaning the reticle pod. Before the cleaning of the reticle pod is performed, the lower cover of outer container 10 is lay on a surface of a washing machine corresponding to and opposite to the first inner surface 101 of the lower cover of outer container 10. The washing machine carries the reticle pod to rotate and thus to generate a centrifuge force under rotation. The drain holes 105 in the embodiment are arranged on sides 102 of the lower cover of outer container 10, that is, the disposition locations of the drain holes 105 are located on the tangent direction of rotation of the reticle pod. Therefore, the centrifuge force carries the remained water in the lower cover of outer container 10 to drain out through the drain holes 105 located on the tangent direction of rotation. It will accelerate to drain out the remained water molecules in the lower cover of outer container 10.

Figure 2:
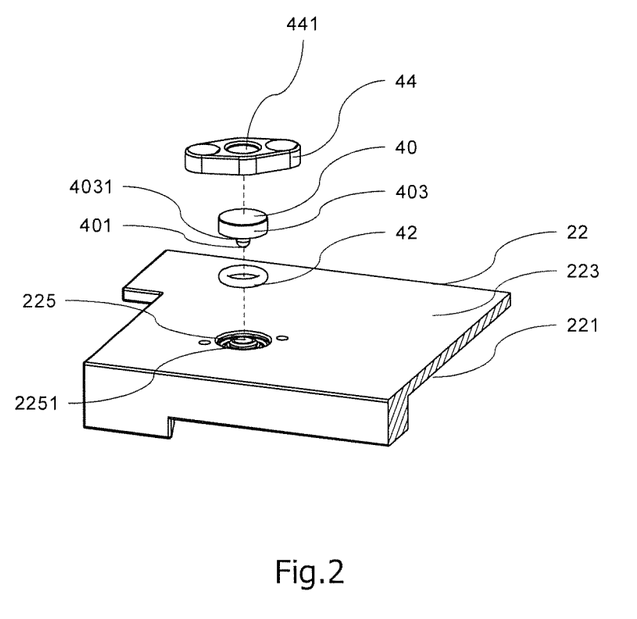
FIG. 2 is a view of the retainer of the upper cover of inner container of the present invention.

Then, referring to FIG. 2, which is a view of the retainer of the upper cover of inner container of the present invention. As shown in FIG. 2, a plurality of through holes 225 are disposed between the second inner surface of inner container 221 and the outer surface of upper cover of inner container 223; in addition, an O-shaped recess 2251 is formed as surrounding each of the through holes 225 and is disposed with a spring element 42. Moreover, a retainer 40 is disposed in each of the through holes 225. The retainer 40 is formed by a supporting convex pillar 401 with a size fitting for being inserted into a through hole 225 and an O-shaped protruding portion 403 correspondingly disposed in the O-shaped recess 2251; the supporting convex pillar 401 and the O-shaped protruding portion 403 are an integrated structure; wherein, the supporting convex pillar 401 is inserted into the through hole 225, and the O-shaped protruding portion 403 is in the O-shaped recess 2251 and the protruding portion 4031 of the O-shaped protruding portion 403 is in contact with the spring element 42; apparently, the length of the supporting convex pillar 401 of the retainer 40 is larger than that of the protruding portion 4031 of the O-shaped protruding portion 403. Additionally, the position of each retainer 40 corresponds to each second supporter 32 of the upper cover of outer container 12. Furthermore, on each retainer 40 on the outer surface of upper cover of inner container 223, a plurality of first fasteners 44 that fastens the retainers 40 are disposed, the first fasteners 44 respectively cover a plurality of through holes 225 to fastens each of the retainers 40 for corresponding to the through holes 225. Each of the first fasteners 44 having a hole 441 with a size smaller than the retainer 40 so that part of the surface of the retainer 40 can be exposed; therefore, with the O-shaped recess 2251 and the first fastener 44 being joined together, the retainer 40 can be fastened and prevented from dropping down. Moreover, the first fastener 44 of the present invention is lock-fastened to the inner container 2 for storing the reticle with a screw and can also be disposed in the inner container 2 for storing the reticle either via being snap-fitted or adhered to the inner container 2, the way of which is not limited in the present invention. And the material of retainer 40 is a wear-resistant polymer material so that friction that may generate particles and dusts which contaminate the reticle 9 in the inner container 2 can be prevented.

Figure 3:
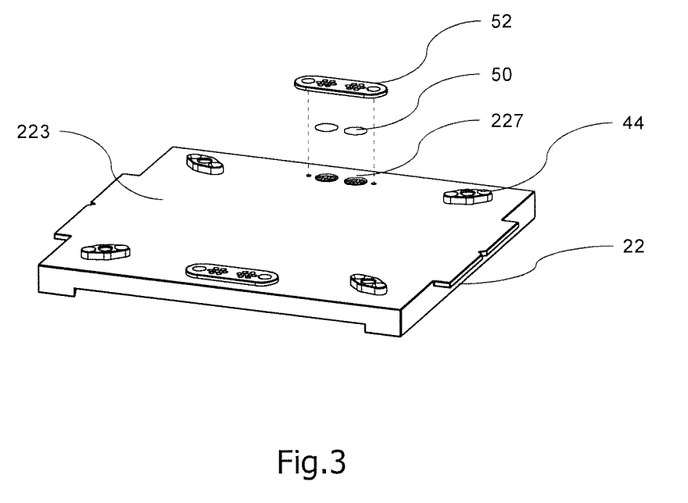
FIG. 3 is a view of the filter device of the upper cover of inner container of the present invention.

Referring then to FIG. 3, which is a view of filter device of the upper cover of inner container of the present invention. As shown in FIG. 3, at least a filtration hole 227 is formed on the outer surface of upper cover of inner container 223, and at least a filtration. device 5 is arranged on the filtration hole 227, in which the filtration device 5 includes a filter material 50 and a second retainer 52. The filter material 50 is disposed on each filtration hole 227. The filter material 50 of the present invention can be a porous filter membrane and can be selected from the group consisting of: glass-fiber filter, static electricity filter, electrically conductive filter membrane, PTFE filter, and porous ceramic material, which is not limited in the present invention. Moreover, a second retainer 52 can be further disposed on the filtration hole 227 to reinforce the fastening; the second retainer 52 can be lock-fastened to the outer surface of upper cover of inner container 223 via a screw or in other ways, the way of lock-fastening the second retainer 52 is not limited in the present invention. In a preferred embodiment of the present invention, two filtration holes form a set and the upper cover of inner container 22 is disposed with two sets of filtration holes 227, and yet the actual number of filtration holes 227 disposed is not limited in the present invention.

Figure 4:
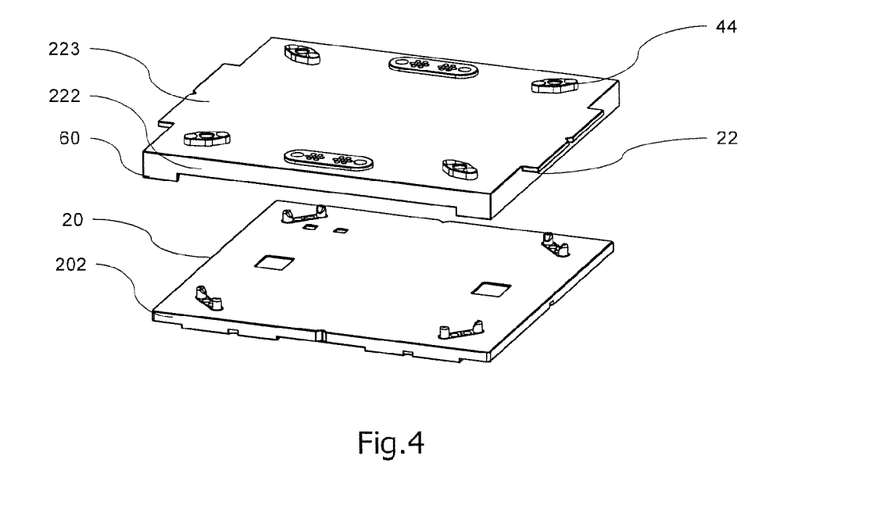
FIG. 4 is a view of the foolproof structure of the upper cover of inner container of the present invention.

And then, referring to FIG. 4, which is a view of foolproof structure of the upper cover of inner container of the present invention. As shown in FIG. 4, an integrated foolproof structure 60 is respectively formed on four corners arranged on the upper cover periphery 222 of the upper cover of inner container 22. The characteristic is in that a portion of the foolproof structure 60 of the present invention will protrude from the upper cover periphery 222 of the upper cover of inner container 22, and thus, when the upper cover of inner container 22 and the lower cover of inner container 20 are joined together, the protruding portion of the foolproof structure 60 will be snap-fitted on the lower cover periphery 202 of the lower cover of inner container 20; since the foolproof structure 60 is respectively formed on the four corners, when the inner container 2 is closed, the upper cover 22 and the lower cover 20 are successfully joined only when all the foolproof structures 60 on four corners are snap-fitted, the foolproof effect being thus achieved. Moreover, as the length and the width of the inner container 2 are not the same, the length-to-width ratio can also be taken into consideration when the inner container 2 is closed for determining whether the closing of inner container 2 is correctly performed.

Figure 5:
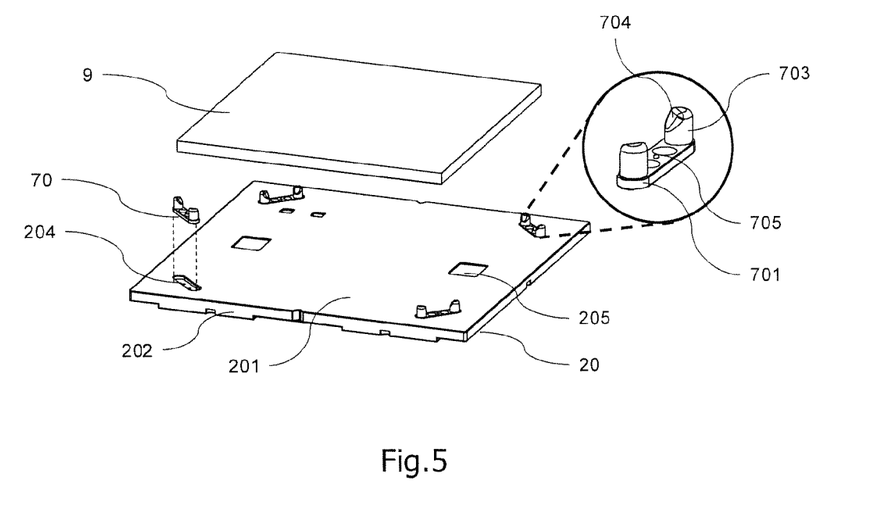
FIG. 5 is a view of the limiter of the lower cover of inner container of the present invention.

Referring then to FIG. 5, which is a view of the limiter of lower cover of inner container of the present invention. As shown in FIG. 5, each of the four corners of the first inner surface of inner container 201 of the lower cover of inner container 20 has a recess 204, in which a limiter 70 is respectively disposed; the limiter 70 is a horizontal bar-shaped substrate 701 with two convex columns 703 disposed on two sides, and a bevel 704 is respectively formed at the open end of each of the convex columns 703; a supporting protruding point 705 is further disposed between the two convex columns 703 of the horizontal bar-shaped substrate 701, and the supporting protruding point 705 and the two convex columns 703 are disposed on a straight line. When the limiter 70 is disposed in the recess 204 of the first inner surface of inner container 201, the top surface of the horizontal bar-shaped substrate 701 of the limiter 70 and the first inner surface of inner container 201 will be on the same horizontal level. When the reticle 9 is to be placed onto the first inner surface of inner container 201, if the reticle 9 shifts its position, the reticle 9 can be guided to the correct position by the bevels 704 of the convex columns 703 and each of the four corners of the reticle 9 is in contact with the supporting protruding point 705 on the horizontal bar-shaped substrate 701; the reticle 9 is thus placed onto the first inner surface of inner container 201.

Moreover, the pair of convex columns 703 on each limiter 70 can serve as identification devices on the robot to identify reference point for reticle alignment so that the robot can accurately grip the reticle. Furthermore, in addition to being disposed at four corners of the first inner surface of inner container 201, each limiter 70 of the present invention can be alternatively disposed on the point of intersection at 146 mm on each side of the first inner surface of inner container 201; therefore, the position of each limiter 70 on the first inner surface of inner container 201 is not limited in the present invention as long as the position of each limiter 70 is on or beyond the point of intersection at 146 mm on each side of the first inner surface of inner container 201, such design ensuring that the supporting protruding point 705 of each limiter 70 is only in contact with the edge of the reticle and does not cause wear of or damage to pattern on the reticle.

Figure 6:
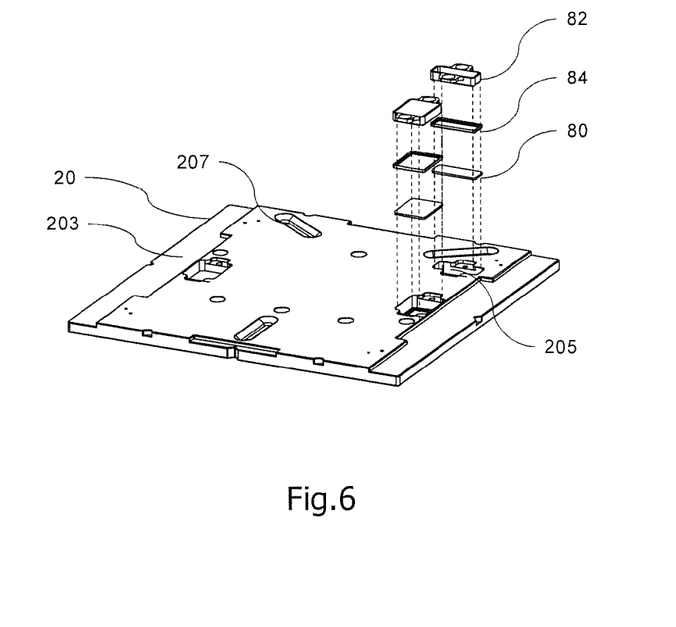
FIG. 6 is a view of the window of the lower cover of inner container of the present invention.

Then, referring to FIG. 6, which is a view of the window of the lower cover of inner container of the present invention. As shown in FIG. 6, a plurality of windows 205 are disposed on the outer surface of lower cover of inner container 203 which is on the opposite side of the first inner surface of inner container 201, and a transparent substrate 80 made of transparent glass, transparent plastic material, or other materials is respectively disposed in each of the windows 205; on the transparent substrate 80, a third fastener 82 is disposed on the outer surface of lower cover of inner container 203 of the lower cover of inner container 20 to cover the windows 205, and further disposed for snap-fitting the transparent substrate 80 to the window 205 and prevent the transparent substrate 80 from dropping down. The third fastener 82 is a frame-shaped member with a size fitting to the window, and thus the reticle inside can be monitored from outside the lower cover of inner container 20 via the window 205. Therefore, during the process, there will be signals from platforms to inspect the process and function of a reticle via the window 205. Moreover, a ring-shaped pad 84 is disposed between the transparent substrate 80 and the third fastener 82 and is made of polymer material such as PTFE; the primary objective of disposing the ring-shaped pad 84 is to isolate and thus prevent the transparent substrate 80 from contacting the third fastener 82 so that proper flexibility is allowed to protect the transparent substrate 80 from being damaged. Furthermore, after the third fastener 82 is disposed on the lower cover of inner container 20, the third fastener 82 and the outer surface of lower cover of inner container 203 are at the same horizontal level, and thus the placement of the inner container 2 in the outer container 2 will not be hindered. The third fastener 82 of the present invention is lock-fastened onto the outer surface of lower cover of inner container 203 of lower cover of inner container 20 via a screw, and the way of lock-fastening is not limited in the present invention.

Figure 7:
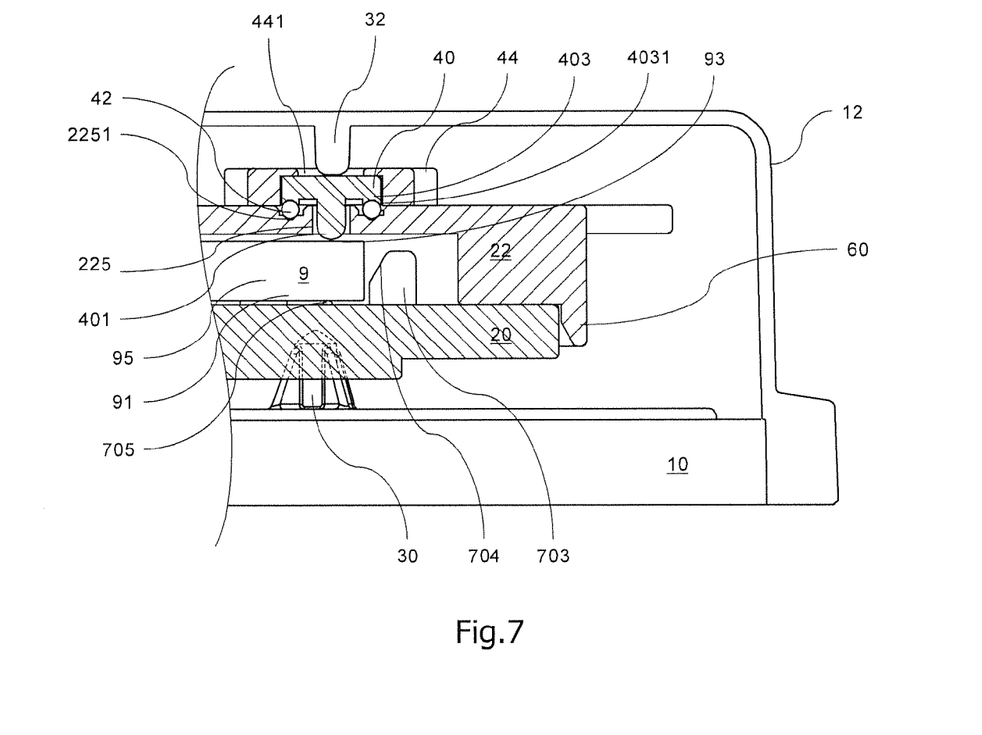
FIG. 7 is a sectional view of the reticle pod of the present invention.

Referring to FIG. 7, which is a sectional view of the reticle pod of the present invention. As shown in FIG. 7, the reticle 9 is first placed on the lower cover of inner container 20 of the inner container 2, and, as described above, the four corners of the lower surface 91 of the reticle 9 will be first placed on the supporting protruding points 705 of the limiters 70 disposed on the four corners of the first inner surface of inner container 201. The two columns 703 on two sides of each supporting protruding point 705 will be located right on the periphery 95 of the reticle 9 (namely, two sides of the right-angle corner). Thus, the two sides of each of the four right-angle corners of the reticle 9 will be respectively clamped by each convex column 703 and the reticle 9 can be prevented from shifting. In the following, facilitated by the guidance of the foolproof structure 60 of the upper cover of inner container 22, the upper cover of inner container 22 is joined with the lower cover of inner container 20 in the designated direction and an inner container 2 for protecting the reticle 9 is thus formed.

Then, the inner container 2 is placed onto the plurality of first supporters 30 of the lower cover of outer container 10 of the outer container 1; wherein, the first supporters 30 correspond to the positioning groove 207 of the outer surface of lower cover of inner container 203 of the lower cover of inner container 20 (referring to FIG. 6), and therefore, the inner container 2 is guided by the positioning groove 207 to the correct position when being placed. The upper cover of outer container 12 is then closed; wherein, when the upper cover of outer container 12 is to be closed, each of the second supporters 32 on the upper cover of outer container 12 aligns with the retainer 40 in each of the through holes 225 of the upper cover of inner container 22. When the upper cover of outer container 12 is closed, each second supporter 32 is driven by the closing action to exert a downward force and impose pressure on the exposed portion of the retainer 40 in the through hole 225; when the retainer 40 is pressed, the O-shaped protruding portion 403 will then impose pressure on the O-shaped spring element 42 in the O-shaped recess 2251, and the retainer 40 will then press further down and inward (i.e. when the O-shaped spring element 42 is pressed, there is flexible space for the retainer 40 to press inward, and contrariwise, when the O-shaped spring element 42 is not pressed, its flexibility facilitates the retainer 40 to resume the original position); the supporting convex pillars 401 integrated with the O-shaped protruding portions 403 will also be pressed down and inward and will then be in contact with four corners of the upper surface 93 of the reticle 9, in other words, when the upper cover of outer container 12 is closed, the supporting convex pillars 401 of the retainers 40 at four corners of the reticle 9 will press the four corners of the upper surface 93 of the reticle 9, and therefore the reticle 9 can be stably fastened in the inner container 2 with the existent support from the supporting protruding points 705 of the four corners of the lower surface 91 of the reticle 9; the inner container 2 can also be stabilized with the second supporters 32 of the upper cover of outer container 12 pressing inward, and the security of the reticle 9 in the storing and transporting process is further ensured.

Although the present invention has been described with reference to the aforementioned preferred embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A reticle pod with a drain structure, comprising:
an outer container, comprising: and
a lower cover of outer container, having a first inner surface and four sides connected with said first inner surface, a plurality of first supporters being formed on said first inner surface, a plurality of drain holes disposed on the lower cover of outer container;
an upper cover of outer container, having a second inner surface, a plurality of second supporters being formed on said second inner surface, said first inner surface and said second inner surface forming a first accommodation space when said lower cover of outer container and said upper cover of outer container are joined together; and
an inner container comprising:
a lower cover of inner container, being disposed in said first accommodation space and being in contact with said first supporters, said lower cover of inner container having a first inner surface of inner container; and
an upper cover of inner container, being in said first accommodation space and having a second inner surface of inner container and an outer surface of upper cover of inner container which is on opposite side of said second inner surface of inner container, said first inner surface of inner container and said second inner surface of inner container forming a second accommodation space for accommodating a reticle when said lower cover of inner container and said upper cover of inner container are joined together;
a plurality of through holes, being formed between said second inner surface of inner container and said outer surface of upper cover of inner container; and a plurality of retainers, being respectively disposed in said plurality of through holes, the position of each of said plurality of retainers corresponding to each of said second supporters of said upper cover of outer container.

2. The reticle pod according to claim 1, wherein a plurality of first fasteners are disposed on said outer surface of upper cover of inner container and used to fasten said retainers.

3. The reticle pod according to claim 2, wherein the first fasteners are screwed on said upper cover of inner container.

4. The reticle pod according to claim 1, wherein material of said retainer is a wear-resistant polymer material.

5. The reticle pod according to claim 1, wherein at least a filtration hole is further disposed on said outer surface of upper cover of inner container, at least a filtration device is disposed on said filtration hole, said filter device comprising:
a filter material, disposed on said filtration hole; and a second fastener, disposed on said outer surface of upper cover of inner container to cover said filtration hole for fastening said filter material on said filtration hole.

6. The reticle pod according to claim 5, wherein said filter material is a porous filter membrane.

7. The reticle pod according to claim 5, wherein said second fastener is screwed on said outer surface of upper cover of inner container.

8. The reticle pod according to claim 1, wherein an integrated foolproof structure is further respectively formed on four corners on upper cover periphery of said upper cover of inner container, said foolproof structure protrudes from said upper cover periphery of said upper cover of inner container, and when said upper cover of inner container and said lower cover of inner container are joined together, said foolproof structure that protrudes is snap-fitted on said lower cover periphery of said lower cover of inner container.

9. The reticle pod according to claim 1, wherein said outer surface of lower cover of inner container further comprising: a plurality of windows; a plurality of transparent substrates, mounted on said windows respectively; and a plurality of third fasteners, respectively disposed on said outer surface of lower cover of inner container and covered on said windows for fastening said transparent substrate; wherein a plurality of ring-shaped pads are disposed between said transparent substrate and said third fastener respectively.

10. The reticle pod according to claim 9, wherein said third fasteners are screwed on the outer surface of lower cover of inner container.

11. The reticle pod according to claim 1, wherein, an O-shaped recess is formed around each of said plurality of through holes to surround each of said through holes, and a spring element is disposed in said O-shaped recess.

12. The reticle pod according to claim 11, wherein, each of said plurality of retainers is formed by a supporting convex pillar and an O-shaped protruding portion correspondingly disposed in said O-shaped recess, length of said supporting convex pillar being larger than length of said O-shaped protruding portion and said supporting convex pillar and said O-shaped protruding portion is an integrated structure, wherein, said O-shaped protruding portion is located in said O-shaped recess and said O-shaped protruding portion is in contact with said spring element.

13. The reticle pod according to claim 1, further comprising: a plurality of limiters, disposed on four corners of said first inner surface of inner container.

14. The reticle pod according to claim 13, wherein each of said plurality of limiters comprises: a horizontal bar-shaped substrate; two convex columns, disposed on two sides of said horizontal bar-shaped substrate; and a supporting protruding point, disposed between said two columns of said horizontal bar-shaped substrate.

15. The reticle pod according to claim 14, wherein material of said plurality of limiters is a wear-resistant polymer material.

16. The reticle pod according to claim 14, wherein a bevel is formed at open end of each of said convex columns of said plurality of limiters.

17. The reticle pod according to claim 1, wherein the drain holes are disposed on said sides of said lower cover of outer container, a pair of lock holes is further disposed on a pair of opposite sides among four sides of said lower cover of outer container.

* * * * *